US011782081B2

(12) United States Patent
Chugg

(10) Patent No.: US 11,782,081 B2
(45) Date of Patent: Oct. 10, 2023

(54) ELECTRIC FIELD SENSOR

(71) Applicant: MBDA UK LIMITED, Stevenage (GB)

(72) Inventor: Andrew Michael Chugg, Filton (GB)

(73) Assignee: MBDA UK LIMITED, Stevenage (GB)

( * ) Notice: Subject to any disclaimer, the term of this patent is extended or adjusted under 35 U.S.C. 154(b) by 224 days.

(21) Appl. No.: 17/289,510

(22) PCT Filed: Oct. 23, 2019

(86) PCT No.: PCT/GB2019/053016
§ 371 (c)(1),
(2) Date: Apr. 28, 2021

(87) PCT Pub. No.: WO2020/089591
PCT Pub. Date: May 7, 2020

(65) Prior Publication Data
US 2021/0396797 A1    Dec. 23, 2021

(30) Foreign Application Priority Data
Oct. 30, 2018  (GB) ...................................... 1817697

(51) Int. Cl.
*G01R 29/08* (2006.01)
*G01R 35/00* (2006.01)

(52) U.S. Cl.
CPC ....... *G01R 29/0878* (2013.01); *G01R 35/005* (2013.01)

(58) Field of Classification Search
CPC .......................... G01R 35/005; G01R 29/0878
See application file for complete search history.

(56) References Cited

U.S. PATENT DOCUMENTS

| 3,931,573 A | 1/1976 | Hopfer |
| 5,110,216 A | 5/1992 | Wickersheim et al. |

(Continued)

FOREIGN PATENT DOCUMENTS

| EP | 2447688 A1 | 5/2012 | | |
| GB | 2220755 | * 1/1990 | ............. | G01R 21/02 |

(Continued)

OTHER PUBLICATIONS

International Search Report and Written Opinion dated Jan. 14, 2020 issued in PCT/GB2019/053016.

(Continued)

*Primary Examiner* — Alesa Allgood
(74) *Attorney, Agent, or Firm* — Scully, Scott, Murphy & Presser, PC

(57) ABSTRACT

There is disclosed a device for determining a strength of an oscillating electric field. The device comprises an absorber to absorb radiation at the frequency of the oscillating electric field, and a thermal insulator transparent to radiation at the frequency of the oscillating electric field, which thermal insulator is arranged to thermally insulate the absorber. The device also comprises a first temperature sensor arranged to measure the temperature of the absorber, and a second temperature sensor arranged to measure the temperature external to the thermal insulator. Methods of measuring electric field using such a device, and methods of calibrating such a device, are also disclosed.

20 Claims, 4 Drawing Sheets

(56) References Cited

U.S. PATENT DOCUMENTS

| | | | |
|---|---|---|---|
| 5,186,540 A | 2/1993 | Walsh et al. | |
| 10,940,635 B2 * | 3/2021 | Chen | B29C 35/0805 |
| 2008/0202209 A1 | 8/2008 | Lambkin et al. | |
| 2009/0213895 A1 | 8/2009 | Pillans | |
| 2010/0314544 A1 | 12/2010 | Ouvrier-Buffet | |
| 2011/0103424 A1 * | 5/2011 | Imholt | G01J 5/16 |
| | | | 374/45 |
| 2016/0091545 A1 | 3/2016 | Osamu et al. | |
| 2017/0038097 A1 * | 2/2017 | Ni | F24S 80/56 |
| 2018/0058953 A1 | 3/2018 | Byvank et al. | |

FOREIGN PATENT DOCUMENTS

| | | |
|---|---|---|
| GB | 2220755 A | 1/1990 |
| GB | 2451572 A | 2/2009 |
| GB | 2474963 A | 5/2011 |
| WO | 2018049675 A1 | 3/2018 |

OTHER PUBLICATIONS

GB Search Report dated Mar. 7, 2019 issued in GB1817697.4.
International Preliminary Report on Patentability and Written Opinion dated May 14, 2021 issued in PCT/GB2019/053016.

\* cited by examiner

ELECTRIC FIELD SENSOR

FIELD OF THE INVENTION

This invention relates to a sensor for determining the strength of an electric field. More particularly, though not exclusively, the present invention relates to a sensor for determining the strength of a radio-frequency electric field through its heating effect on an absorber material.

BACKGROUND

Antennas can be used to measure electric field strength but suffer from a number of disadvantages that prevent their use for certain applications. In particular antennas can be physically too large to make measurements either in confined spaces or to make measurements at a well-defined location. This problem arises because, as antennas are made smaller, the signal picked up by the antenna cables and circuits can grow to become larger than the signal picked up by the antenna. To mitigate this problem, and to ensure sensitivity to small signals is maintained, the antenna requires a larger electromagnetic cross section (and correspondingly a larger physical size). In addition since antennas require the use of metallic components, it is quite possible that the presence of the antenna itself will distort the electric field, so that the measurements made are not representative of the field strength that would be present in the absence of the antenna.

SUMMARY OF THE INVENTION

The present invention provides an alternative manner of sensing an electric field that mitigates at least some of the above-mentioned problems. In accordance with a first aspect of the present invention there is provided a device for determining a strength of an oscillating electric field, the device comprising an absorber to absorb radiation at the frequency of the oscillating electric field, and a thermal insulator transparent to radiation at the frequency of the oscillating electric field, which thermal insulator is arranged to thermally insulate the absorber; and the device further comprising a first temperature sensor arranged to measure the temperature of the absorber, and a second temperature sensor arranged to measure the temperature external to the thermal insulator.

Such a device enables electric fields to be measured without any significant perturbation of the electric field to be measured. Such a device can be made to be relatively small compared to an antenna and can therefore map an electric field more accurately than has previously been possible. Moreover the use of the thermal insulator enables the sensitivity of the device to be enhanced, since the thermal insulation retains the heat signal within the absorber. This results in a larger temperature difference between the first and second temperature sensors.

The first temperature sensor may be embedded within the absorber. It has been found that such a location is suitable to measure the absorber temperature.

The second temperature sensor may be located on an external surface of the thermal insulator.

The first and second temperature sensors may each comprise an optically interrogable sensing element responsive to changes in temperature. Such temperature sensors can be communicated with via optical fibres, and the temperature of the sensors can be determined from a changing characteristic of an optical signal reflected therefrom. As a result, no metallic wires, which would otherwise distort the electric field to be measured, are needed for the temperature measurement to be made where optically interrogable sensors are used.

The oscillating electric field may be a radio frequency field.

A dimension of the absorber may be comparable to or less than the absorption length of the absorber. In some examples this allows the sensor itself to be small, so that the field inside small cavities can be monitored, or so that measurements of field at precise locations can be made.

The absorber and the thermal insulator may be configured such that the difference in temperatures recorded by the first and second temperature sensors approaches an equilibrium value with a characteristic time constant less than two hundred seconds, preferably less than 30 seconds, more preferably less than 5 seconds, and more preferably less than 1 second.

The first and second temperature sensors may be interrogable via first and second respective optical fibres.

The absorber material may be selected from graphite or Eccosorb®.

The thermal insulation may be selected from expanded polystyrene or high density polyethylene.

The thermal insulation may enclose the absorber. Enclosing the absorber mitigates the possibility that air currents may, for example through convection, affect the temperature of the absorber and therefore affect the measurement of electric field.

The device may further comprise a control unit coupled to the first and second optical fibres, the control unit being operable to transmit light pulses to the sensing elements of the first and second temperature sensors, to receive reflected pulses from the sensing elements, and to process the received reflected pulses to determine the temperature of first and second temperature sensors. The control unit may for example comprise a unit operable to transmit, receive, and analyse light pulses, as may be commercially available with optically interrogable temperature sensors. The control unit may further comprise a standard computer, to which this first unit may be coupled. In this way the control unit may be operable to determine the electric field strength to which the absorber is exposed from the difference between the temperatures measured by the first and second temperature sensors. The control unit may further be operable to determine the electric field strength to which the absorber is exposed from the instantaneous rates of change of temperature measured by the first and second temperature sensors. The first and second temperature sensors may be capable of being optically interrogated at a rate of at least once every ten milliseconds, and preferable at a rate of approximately once every millisecond.

The invention extends to a method of calibrating a device as described above to measure the strength of an oscillating electric field, the method comprising the steps of: preparing the device by placing it in a region devoid of any electric field, such that the first and second temperature sensors measure the same temperature; applying a known and constant electric field to the device; operating the first and second temperature sensors as the constant electric field is applied to determine a plurality of sets of temperature measurements, each of the plurality of sets of measurements being spaced apart by a temporal interval; determining, for each of the plurality of sets of temperatures measurements, the difference between the temperature measured by the first temperature sensor and the temperature measured by the second temperature sensor; thereby determining a plurality of temperature differences; and calculating first and second calibration constants by fitting the plurality of temperature differences to an exponential approach to an equilibrium temperature difference, the first calibration constant defining a characteristic time constant of the device, and the second calibration constant relating an equilibrium temperature difference to a power of the electric field.

The temporal interval may be short relative to the characteristic time constant, and the plurality of sets of measurements may span a time comprising at least two time constants.

The invention further extends to a method of measuring electric field strength using a device as described above, the method comprising monitoring the difference in temperatures measured by the first and second temperature sensors to determine at least one of a maximum temperature difference and an initial temperature gradient.

The invention further extends to a method of measuring electric field strength using a device as described above, the method comprising monitoring the difference in temperatures measured by the first and second temperature sensors to determine a set of temperature differences, and fitting the set of temperature differences to an exponential approach to an equilibrium temperature.

BRIEF DESCRIPTION OF THE DRAWINGS

Embodiments of the invention will now be described by way of example only and with reference to the accompanying drawings, of which.

DETAILED DESCRIPTION

Figure 1:
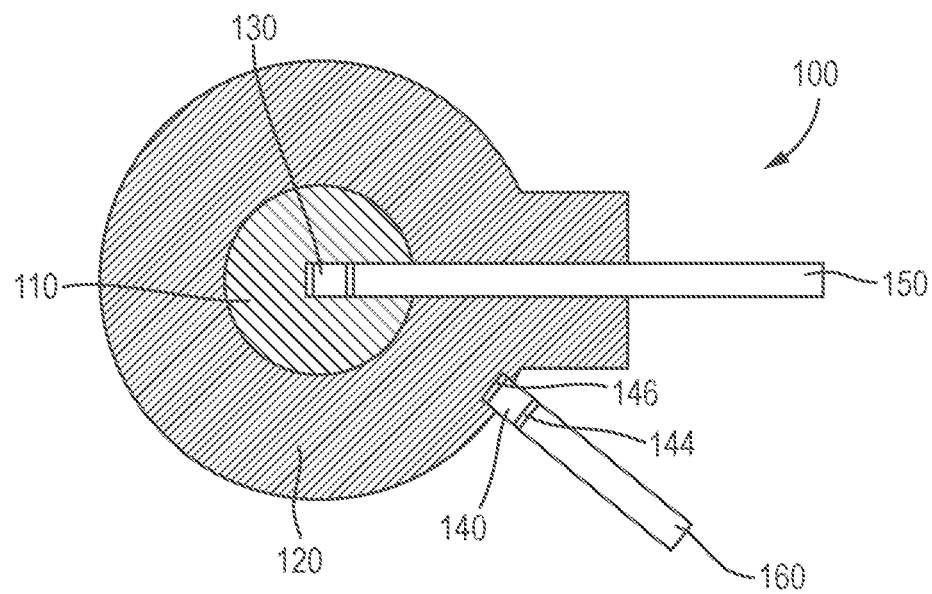
FIG. 1 is a schematic diagram showing a cross section through a device according to a first embodiment of the invention.

A device 100 according to a first embodiment of the present invention is shown in cross section in FIG. 1 and is arranged to determine the strength of an ambient radio frequency (RF) electric field. Device 100 comprises a radio frequency absorber material 110 surrounded by thermal insulation 120. The thermal insulation is selected to be transparent to RF radiation. Embedded in the absorber 110 is a first temperature sensor 130. A second temperature sensor 140 is located outside the thermal insulation 120. Both the first and second temperature sensors comprise a material whose optical response varies with temperature.

Accordingly the first and second temperature sensors allow the temperatures to be determined by analysing their response to an input optical pulse. In the present example the sensors can be interrogated by transmission of an optical pulse from a control unit. The control unit is connected to the first and second temperature sensors by optical fibres 150 and 160 respectively. The control unit analyses the return pulse to determine the temperature of the sensor. In addition the control unit logs the determined temperature and the time at which the temperature was recorded. The difference in temperature between the first and second temperatures, and the rate of change of this difference in temperature, can be related to the strength of the electric field as will be explained below.

One exemplary temperature sensor uses a gallium arsenide sensor chip that can be interrogated by a broad spectrum light pulse. The light pulse is transmitted through optical fibres from the control unit to the gallium arsenide sensing element. As indicated for the second, external temperature sensor 140, an anti-reflection dielectric coating 144 is provided at the interface between the optical fibre 160 and the GaAs sensing element 140. A high reflection dielectric coating 146 is provided on the opposite side of the GaAs element 140. These coatings promote transmission of light into the sensing element 140 and reduce the amount of light lost through leakage into the absorber material 120. By measuring an optical absorption spectrum of the reflected light it is possible to determine the position of a transition in the GaAs optical absorption spectrum. Since the position of the transition varies with temperature in a known way the sensor chip can be optically interrogated to determine temperature. Such sensors are available from Opsens Inc, of Quebec, Canada, and include for example the OTG-R-100ST sensor that is used as the first and second temperature sensor in the device 100.

The components used in the device 100 reduce the distortion of the electric field in comparison to antennas. In contrast to an antenna, device 100 has no metallic components. In addition device 100 does not require a (metallic) connection to its control unit since the temperature sensors are interrogated optically via non-metallic optical fibres. Further, the thermal insulation can be selected to be transparent to RF radiation, and, as is explained further below, it is not necessary for the absorber to be of significant size to obtain a measurable temperature difference.

The relationship of the difference in temperatures measured by the first and second temperature sensors to the electric field strength will now be explained with reference to an approximate model of the device 100. In the presence of an RF electric field energy will be absorbed by the absorber 110 and dissipated as heat within the absorber. The temperature of the absorber will rise until a thermal equilibrium has been reached in which the amount of heat dissipated through the thermal insulation is equal to the amount of heat generated in the absorber by the electric field. This temperature difference is determined from the measurements made by the first and second temperature sensors. The electric field can be determined for example from the temperature difference at equilibrium, as is explained below, beginning with an approximate analysis of the thermal equilibrium in which the energy absorbed from the electric field is equal to the energy dissipated through the thermal insulation.

It has been found that a one dimensional approximation to the actual device 100 is sufficient to operate the device to measure electric field. In the following analysis it is therefore assumed that an absorber is on one side of a thermal insulator of thickness $r_{ins}$ extending in the x direction. Fourier's law of heat transfer holds that the heat flow through a surface is proportional to the temperature gradient across the surface such that:

$$-K_{ins}\frac{\partial \theta}{\partial x} = \frac{P}{A} \quad (1)$$

where θ is the temperature of the insulator relative to the ambient temperature, $K_{ins}$ is the thermal conductivity of the thermal insulator, P is the power (equivalent to the power absorbed from the electric field by the absorber), and A is the cross-sectional area of the interface.

The inner surface of the thermal insulator has the specified constant heat flow arising from the absorber, and the outer surface is deemed to be in contact with ambient air such that θ=0 at the outer surface. It will be noted that, in device 100, the second temperature sensor directly measures the temperature at the outer surface of the insulator, thus providing a measure of the ambient temperature. The one-dimensional form of the thermal diffusion equation can be used in order to obtain an approximate solution for the temperature profile through the thermal insulator:

$$\frac{\partial \theta}{\partial t} = \frac{K_{ins}}{C_{ins}\rho_{ins}}\frac{\partial^2 \theta}{\partial x^2} \quad (2)$$

where $C_{ins}$ is the heat capacity of the thermal insulator and pins is its density. However, in the equilibrium condition:

$$\frac{\partial \theta}{\partial t} = 0 \quad (3)$$

This applies at all x, so the heat flow out of the exterior surface must equal the heat flow into the interior surface. It therefore follows from (2) that:

$$\frac{\partial^2 \theta}{\partial x^2} = 0 \quad (4)$$

Figure 2:
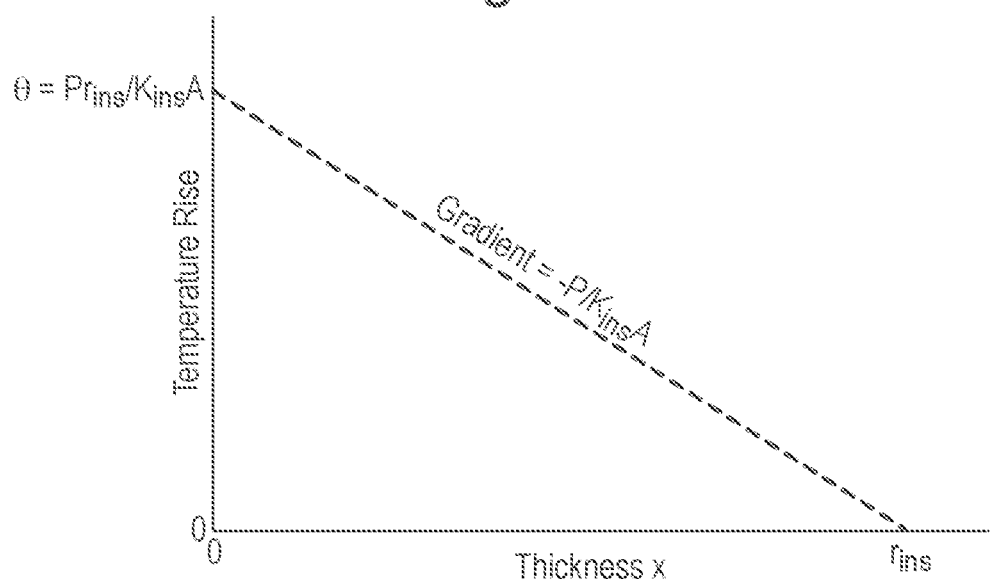
FIG. 2 is a graph indicating the equilibrium temperature profile in a thermal insulator obtained from a one-dimensional analysis of the thermal diffusion equation.

It is apparent from integration of (4) that ∂θ/∂x must be constant between the interior and exterior surfaces of the thermal insulator and must be equal at all values of x to its value on the boundaries (as determined from (1) above). As above, it can be taken that θ=0 at the external surface. In addition, the value ∂θ/∂x is known from (1). The form of the solution is therefore as shown in FIG. 2, which is a graph illustrating the linear decrease in temperature exhibited in the insulator on moving from the internal side (at x=0) to the external side (at x=$r_{ins}$) when the insulator is at thermal equilibrium. It will be seen that this determines the increase in temperature internal to the thermal insulator as:

$$\theta = \frac{Pr_{ins}}{AK_{ins}} \quad (5)$$

where $r_{ins}$ is the thickness of the thermal insulator. This corresponds to the temperature elevation of the absorber over that external to the thermal insulator in device 100.

Since the first temperature sensor 130 of device 100 measures the temperature of the absorber 110, the difference in temperature between the first and second temperature sensors provides a measure of θ at x=$r_{ins}$.

Hence the temperature rise is proportional to the power absorbed from the field and the thickness of the insulating layer, but inversely proportional to the surface area of the absorber and the thermal conductivity of the insulating layer. It does not depend directly on the thermal properties of the absorber or on the density or the heat capacity of the insulator. In an absorber that is significantly smaller in dimension than the absorption length, the power absorbed is proportional to the volume of the absorber. Since the surface area increases more slowly than the volume with increasing radius, there will be a larger temperature rise with a larger volume of absorber.

Depending on the application for which the device 100 is intended it may also be desirable that the temperature rise should equilibrate within a reasonably short time after the electric field in which the device is placed changes. This can be relevant where it is the equilibrium temperature rise that is calibrated against the field strength. Using the approximation that the rate of heat flow into the insulator is proportional to the temperature rise of the absorber relative to the ambient external temperature, a differential equation can be defined for the heating of the absorber, using the absorption power P:

$$d\theta = \frac{P}{\rho_{abs}V_{abs}C_{abs}}\left(1 - \frac{\theta}{\theta_{equilib}}\right)dt \quad (6)$$

where θ is used for the difference between the temperature of the absorber and the ambient temperature, $C_{abs}$ is the heat capacity of the absorber, $V_{abs}$ its volume, and $\rho_{abs}$ its density. Defining the equilibrium temperature $\theta_{equilib}$ to be equivalent to the temperature rise derived in equation (5) above:

$$d\theta = \frac{1}{\rho_{abs}V_{abs}C_{abs}}\left(P - \frac{AK_{ins}\theta}{r_{ins}}\right)dt \quad (7)$$

which can be rearranged and integrated to give:

$$\frac{-r_{ins}}{AK_{ins}}\ln\left(-\frac{AK_{ins}\theta}{r_{ins}} + P\right) = \frac{t}{\rho_{abs}V_{abs}C_{abs}} + q \quad (8)$$

where q is a constant of integration. Rearranging:

$$-\frac{AK_{ins}\theta}{r_{ins}} + P = Q\exp\left(\frac{-AK_{ins}t}{r_{ins}\rho_{abs}V_{abs}C_{abs}}\right) \quad (9)$$

in which Q remains a constant derived from the constant of integration q. From (9), using the boundary condition θ=0 at t=0 it will be seen that Q=P and therefore:

$$\theta = \frac{Pr_{ins}}{AK_{ins}}\left[1 - \exp\left(\frac{-AK_{ins}t}{r_{ins}\rho_{abs}V_{abs}C_{abs}}\right)\right] \quad (10)$$

Thus the time constant $\tau$ for heating of the absorber is:

$$\tau = \frac{r_{ins}\rho_{abs}V_{abs}C_{abs}}{AK_{ins}} \quad (11)$$

and the ultimate temperature rise is:

$$\theta_{max} = \theta_{equilib} = \frac{Pr_{ins}}{AK_{ins}} \quad (12)$$

Figure 3:
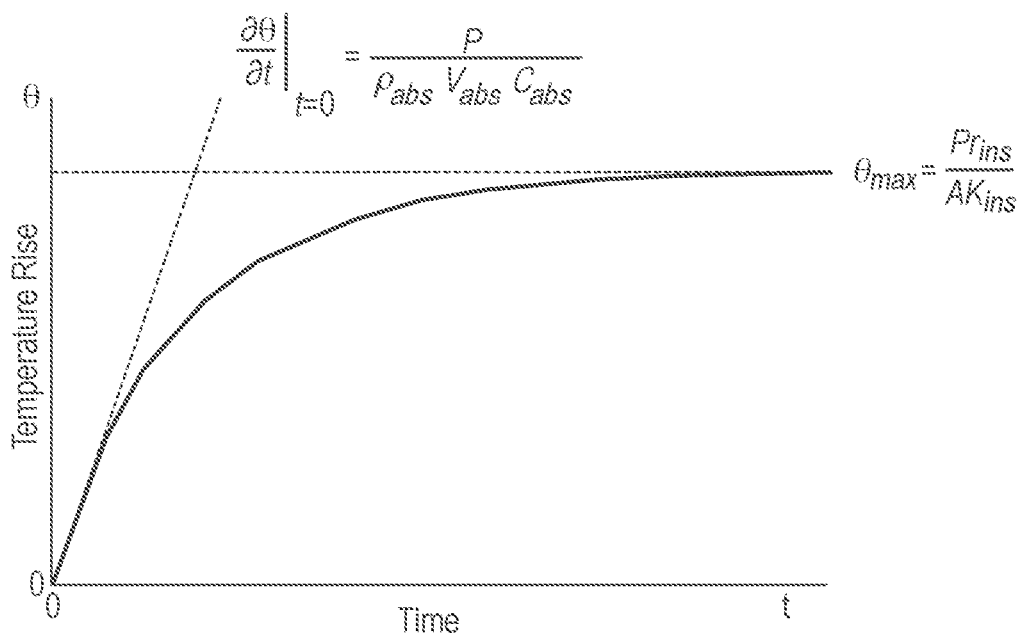
FIG. 3 is a graph indicating the characteristic temperature rise expected to be observed in the device of FIG. 1 as a function of time.

The expected characteristic exponential rise of the temperature difference with time is illustrated by the graph shown in FIG. 3.

In order for it to be possible to use the equilibrium temperature $\theta_{max}$ as the measure of P, it would be necessary to operate the device over a long enough interval for equilibration to be reached (i.e. at least several time constants). It is also desirable to have a large $\theta_{max}$ in order to increase the sensitivity of the device. Yet the same parameters that lead to a large $\theta_{max}$ also engender a long equilibration time, as can be seen from inspection of (11) and (12). Whilst it may be possible in some applications to design a device that will achieve a suitable compromise between these parameters, it is also possible, instead of monitoring the equilibrium temperature rise (reached only after several time constants have elapsed), to measure the rate of change of temperature. The initial rate of change of temperature may be derived by differentiating the basic temperature rise approximation with respect to time:

$$\frac{\partial \theta}{\partial t} = \frac{P}{\rho_{abs}V_{abs}C_{abs}} \exp\left(\frac{-AK_{ins}t}{r_{ins}\rho_{abs}V_{abs}C_{abs}}\right) \quad (13)$$

Hence the initial rate of change of temperature is given by:

$$\left.\frac{\partial \theta}{\partial t}\right|_{t=0} = \frac{P}{\rho_{abs}V_{abs}C_{abs}} \quad (14)$$

and is proportional to the power density in the electromagnetic wave. This initial rate of change of temperature will persist on timescales short compared with the time constant, whilst the temperature elevation of the sensor is small compared with the maximum temperature rise for the power density level. The full temperature function (10) of the device can alternatively be used to calculate the power density P at intermediate times.

A calibration procedure can be performed prior to using the device 100 for actual measurements in order that the measured temperature difference between the first (absorber) 130 and second (external) 140 temperature sensors can be related to the electric field strength. For calibration purposes the temperature rise equation, (10) above, reduces to:

$$\theta = BP\left[1 - \exp\left(\frac{-t}{\tau}\right)\right] \quad (15)$$

where B is a constant relating the equilibrium temperature difference to the power of the electric field (in this example being a constant of proportionality between the power and the equilibrium temperature difference). The characteristic time constant $\tau$ of the system is independent of the electromagnetic power density and can therefore be measured independently during the calibration procedure. On rearranging (15):

$$\ln\left[1 - \frac{\theta}{BP}\right] = \frac{-t}{\tau} \quad (16)$$

which enables the time constant $\tau$ and the constant of proportionality B to be determined by the calibration procedure as follows.

As a first step in an exemplary calibration procedure, the device is subjected to an RF field having a known and constant power density. The temperature difference $\theta$ between the first and second temperature sensors is monitored as a function of time to provide $\theta(t)$, resulting in a plot that is expected to be as shown schematically in FIG. 3, and the equilibrium temperature rise is reached once several time constants have elapsed. The value of BP is determined as the limit value that the temperature difference tends towards, as can be seen from (15) above. The value of the initial gradient is BP/$\tau$, as will also be seen from differentiating (15). Once a value of BP is established, a better value of $\tau$ may be obtained by plotting ln $$\left[1 - \frac{\theta}{BP}\right]$$

against time t. This curve is expected to be a pseudo-straight line with a gradient of $-1/\tau$. Thus both B and $\tau$ can be determined from this calibration procedure.

It will be appreciated that the mathematical treatment above is only approximate and so the line will in fact only be approximately straight. Insofar as the gradient is not uniform, its value at the early time end is expected in most applications to be the more relevant, since it would normally be desirable to make measurements with the device as quickly as possible. It will also be appreciated that absorbed power may in practice vary with frequency, for example because the absorptivity of the absorber may vary with frequency (as is the case for example with the Eccosorb® material described in further detail below). This variation can be accounted for by varying the parameter B with frequency, whilst $\tau$, which is not dependent on the electromagnetic properties of the absorber, is kept constant. For some applications of the device it may therefore be appropriate to repeat the above calibration procedure across a range of frequencies. Such repetition across a number of frequencies may be appropriate for example where the device is to be used to measure electric field strength of varying frequency fields.

In operation of the device, a set of measurements $\{\theta:t\}$ is obtained. The measurements are taken over a time interval in which it is appropriate to assume that the power density of the electric field (which is proportional to P), is constant. Using calibrated values of B and $\tau$, obtained using the calibration procedure described above, the value $\theta/B$ is plotted against $$\left[1 - \exp\left(\frac{-t}{\tau}\right)\right].$$

The gradient of the resultant pseudo-straight line will be P. Alternatively, a tangential straight line fit can be made to the set of measurements {θ:t} at any particular t and the gradient (i.e. the derivative) obtained to derive P using (15).

Hence it is not necessary to operate the device in either differential or equilibration mode. Instead it suffices for the device to measure the temperature variation over a finite interval (in which, preferably, it can be reasonably assumed that P is constant) to measure P. As a minimum a starting temperature and a finishing temperature (expressed as temperature rises relative to ambient) over a defined measurement interval Δt are required. Clearly, the interval may be arbitrarily short, subject to the constraint that it must be long enough to measure a clear temperature variation with adequate accuracy. The control unit for the device can be configured to record the set of measurements {θ:t} at predetermined time intervals and output P using the results of the calibration procedure. The time intervals can be selected to be short compared to the characteristic time constant of the system τ, so as to give a direct measurement of the gradient.

The measurement time interval will further depend on the desired accuracy of the device, which will in turn depend in part on the inherent measurement accuracy of the temperature sensors used. It can be reasonably assumed that an inherent measurement accuracy of 0.05° C. can be achieved for the first and second temperature sensors. For the device measurements to be accurate to within 10%, we would need to measure a temperature change of at least half a degree. The initial (maximum) gradient of the temperature variation, set out in (14) above, can be used to derive the corresponding time interval:

$$\Delta t = \Delta \theta \frac{\rho_{abs} V_{abs} C_{abs}}{P} = 0.5 \frac{\rho_{abs} V_{abs} C_{abs}}{P} \quad (17)$$

This shows that the measurement time interval is shorter for a larger P as expected. It may appear from (17) that the time interval is reduced for a larger absorption volume, but in fact P, the power dissipated by the electromagnetic waves in the absorber, is also proportional to the volume of the absorber (provided the absorber is thin compared to the absorption length of the RF electric field in the absorber). Therefore the time interval is independent of the physical size of the absorber. In fact a small volume of absorber with a low density and heat capacity and a high RF absorptivity may be preferred. Such a small volume absorber also results in a device that is smaller, and can therefore provide measurements of electric field strength of finer spatial resolution.

Retaining the one-dimensional approximation for the purposes of the present analysis the attenuation of an electric field vector in a sheet of absorber is given by:

$$E_{int}' = E_{int} e^{-\alpha z} \quad (18)$$

where z is the thickness of the absorber and α the absorptivity. The loss of power in the absorber is due to the work done by the electromagnetic wave in oscillating polar molecules within the absorber. This is dissipated as heat. The loss in a thin sheet of absorber illuminated from one side in a metal (i.e. reflective) cavity is the difference between the power that enters the dielectric and the power that re-emerges on the illumination side:

$$P = A \varepsilon_0 c (1 - e^{-2\alpha z}) E_{int}^2 \quad (19)$$

where A is the surface area of the absorber. In the present example it is assumed that the sheet is thin compared to the absorption length 1/α. Where the absorption length is large compared to the thickness of the absorber it is reasonable to make the approximation:

$$P \sim 2A \varepsilon_0 c \alpha z E_{int}^2 \quad (20)$$

and therefore, since Az is the volume of absorber, $$P \sim 2 \varepsilon_0 c \alpha V_{abs} E_{int}^2 \quad (21)$$

It will be understood that the rms electric field value $E_{rms}$ of interest—the field in the cavity in which the device 100 is placed—is related to P by $E_{rms} = \sqrt{377P}$ (in which 377Ω represents the impedance of free space).

The above analysis can be used to determine suitable materials for construction of device 100 illustrated in FIG. 1. In a first example the absorber 110 is made from Eccosorb® FGM-U-80, a polyurethane matrix loaded with a proprietary RF absorber material. The absorber is approximately spherical with a radius of 1 mm. From its datasheet the Eccosorb® material is known to be a wideband microwave absorber, having a typical attenuation of around 20 dB/cm at a frequency of 5 GHz, rising to around 85 dB/cm at 18 GHz. The absorption length is related to the quoted attenuation β in dB/cm through the relationship α=β/(10 $\log_{10}$ e). Thus, at 5 GHz the absorptivity is 4.605 cm$^{-1}$ and the absorption length is 2.2 mm for the Eccosorb® material, using the 20 dB/cm value quoted in the Eccosorb® leaflet. Its density is 4000 kg/m$^3$, and its heat capacity can be assumed to be similar to that of polyurethane and therefore approximately 1500 J/kg/K.

The insulator 120 can be made from expanded polystyrene, which exhibits low RF absorptivity and has density 20 kg/m$^3$, heat capacity 1500 J/kg/K, and thermal conductivity 0.04 W/m/K. Use of expanded polystyrene is suitable for a device having high sensitivity. The insulator 120 is formed as a shell of thickness 1 cm around the absorber 110, so that the overall radius of the device 100 is 1.1 cm. Such an exemplary device is physically small, and so is able to probe field strength in small spaces and cavities within equipment under test. In addition the small volume of absorber results in little perturbation of the field being measured.

Assuming the above analysis can be applied to the present example device in which the absorber is a sphere, and neglecting any changes that might be necessary due to the different geometry of the system, for a sphere of Eccosorb® absorber of radius 1 mm, at an RF frequency of 5 GHz, $P \sim 1 \times 10^{-8} E_{int}^2$, corresponding to a power of about 10 mW in a field of 1000V/m. The maximum temperature rise, obtained from (12) above and using values of the parameters appropriate for expanded polystyrene, will be approximately 200° C. The measurement time interval, from (17) above, will be approximately 0.4 s, and the time constant for the system, defined in (13) and (15), will be approximately 150 s.

For this first example, therefore, the time constant is long compared to the reading time. The high equilibrium temperature may make the device very sensitive, particularly if measurements can be made over several minutes. Alternatively it will be possible to use the device in a non-equilibrium mode using the rate of temperature rise to derive the power lost in the absorber through (14) above, noting that measurements can be made on a timescale significantly shorter than the time constant.

To produce a device with a smaller time constant, that would enable readings to be produced more quickly (within a timescale of a few seconds, for example), a thinner insulation layer with a higher thermal conductivity can be used. Expanded polystyrene is fragile in thin layers and so more robust plastics can be considered. It will be noted that the measurement time (from (17) above) is only affected by changes to the absorber kernel, and not by changes to the insulating casing. The same Eccosorb® absorber kernel can be used with a 1 mm thick insulation casing fabricated form high density polyethylene (HDPE). HDPE has a density between 930 and 960 kg/m³, a heat capacity of 2400 J/kg/K, and a thermal conductivity of 0.45 W/m/K. It also exhibits low RF absorptivity. This results in a time constant of order 1 s and a peak temperature rise of order 2 K for a 1000V/m field at 5 GHz, with the measurement interval remaining at around 0.4 s. Such a device is smaller than the first example described above, and so better able to probe small and/or difficult to access spaces within equipment under test. Because HDPE is more robust than expanded polystyrene such a device will also be more robust than the first example described above.

Figure 4:
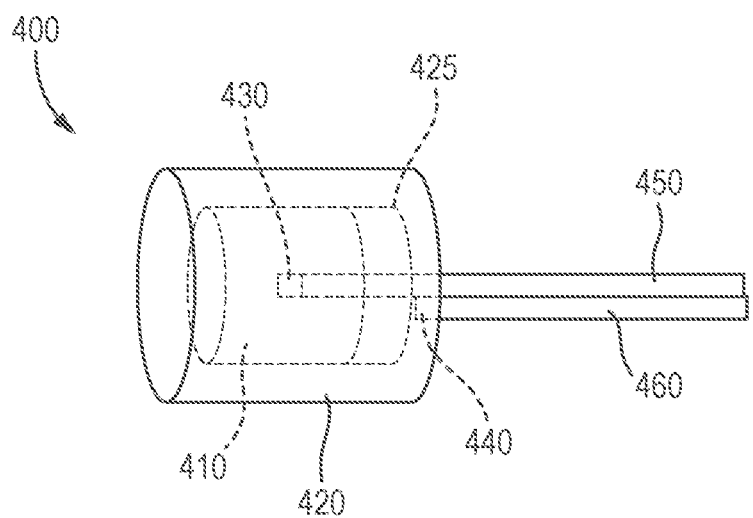
FIG. 4 is a schematic diagram showing a cross-section through a device according to a second embodiment of the present invention.

A device 400 according to a second embodiment of the invention is shown in FIG. 4. The second example device is similar to the first embodiment, but has a cylindrical geometry, which has been found to be simpler to fabricate. In addition, use of a cylindrical shape in which the diameter of the cylinder is approximately equal to the length of the cylinder is well-suited to the application of measuring electric fields in small spaces via holes drilled to afford access for the purpose. Such a cylinder can in addition have a larger mass of absorber than a corresponding sphere of the same diameter. The difference in heat retention efficiency is modest. In other respects the device 400 is similar to device 100 and similar features have been labelled with similar reference numerals, incremented by 300.

Device 400 comprises an Eccosorb® absorber kernel 410 surrounded by HDPE thermal insulation 420. The absorber kernel 410 is in the form of a cylinder, with length 2 mm and diameter 3 mm. The insulation is of thickness 1 mm, with internal diameter 3 mm and external diameter 5 mm, and length 2 mm. It is cut from a longer hollow cylinder of HDPE, with additional HDPE discs provided at either end to enclose the absorber. Note for clarity only HDPE disc 425 is shown in FIG. 4. The absorber 410 can be push-fitted into the HDPE insulation casing 420, and subsequently caps of HDPE, in the form of 1 mm thick discs of diameter 4 mm to 5 mm, and cut from a planar sheet of HDPE, are adhered to either end of the HDPE casing 420 using an epoxy adhesive. The amount of epoxy used is just sufficient to ensure adhesion of the HDPE to the absorber. Disc 425, through which the optical fibre 450 passes, is shown at one end of the insulation. The adhesive is applied around the circumference of the discs so as to mitigate circulation of air within the casing which could result in convective heat transfer around the absorber kernel. One of the discs can be adhered to casing 420 once the absorber 410 is fixed within the casing. Disc 425, through which the optical fibre 450 passes, is adhered in a subsequent step as is described in further detail below.

Embedded in the absorber 410 is a first temperature sensor 430. A second temperature sensor 440 is located outside the thermal insulation 420. As in the above embodiment, Opsens temperature sensors are used for both the first and second temperature sensors 430, 440. Optical fibres 450 and 460 allow for an optical pulse to be transmitted so as to interrogate the temperature sensors. In the present embodiment relatively large diameter (0.1 mm) optical fibres are used so that a large flux of light can be transmitted. In this way the temperature can be measured more accurately with a larger signal to noise ratio. The sensor end of each of the first and second temperature sensors has a section of bare glass-fibre protruding about 5 mm beyond the end of the insulation around the optical fibre. At the end of this bare glass-fibre section is the gallium arsenide sensor chip (for the first temperature sensor, at 430), which is approximately 0.1 mm long.

In order to position the temperature sensor 430 within the absorber a hole is pierced through the HDPE disc 425 prior to adhering it to the casing 420, using a needle or other similar means, such that the temperature sensor 430 can be inserted through disc 425. Subsequently the disc and temperature combination is attached to the absorber 410 and casing 420. This must be done delicately because the bare glass-fibre section of the optical fibre is fragile. In device 400 it is necessary to insert a 2 mm length of the optical fibre into the absorber and insulator, leaving 3 mm of bare glass fibre external to the absorber/insulator head. Insertion can be achieved by applying a 3 mm long insulating sheaf to the bare glass-fibre, leaving 2 mm protruding, and fixing the sheaf in place using a small amount of epoxy. Subsequently the 2 mm protruding section is carefully inserted through the disc 425 and adhered in position, again using epoxy. Finally, having pierced a suitable hole in the absorber 410 using a needle or similar means, the temperature sensor 430 and disc 425 combination is positioned with the temperature sensor in the centre of the absorber 410, and again fixed in place using a small amount of epoxy. In this way the sensor is correctly positioned in the centre of the absorber and the bare glass-fibre section is protected from the environment.

The external temperature sensor 440 can be positioned anywhere on the external surface of the thermal insulation, on the cylindrical section or either of the two cap sections. As shown in FIG. 4 it is convenient to position the sensor 440 on the surface of disc 425 such that the fibre 460 can run closely adjacent to fibre 450. This configuration provides mutual additional support and robustness to the optical fibres. The two optical fibres 450, 460 can be tied together so as to enhance the mutual support.

Figure 5:
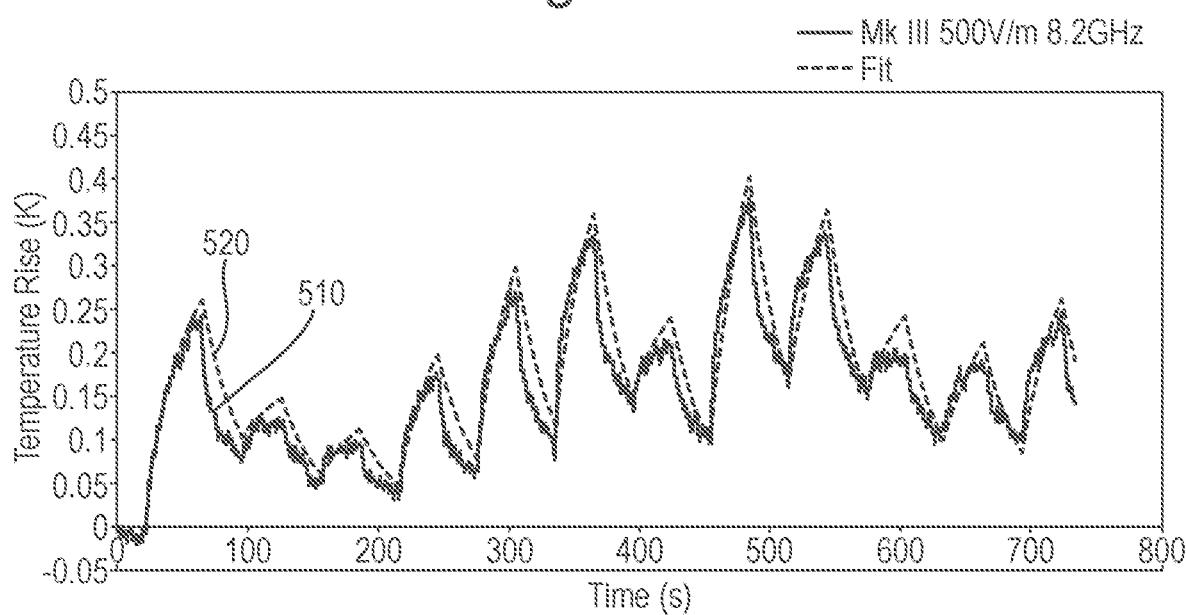
FIG. 5 illustrates results obtained from the device of FIG. 4 when exposed to a sequence of 12 test fields with exposure durations of 30 s followed by cooling periods of 30 s with the test field off.
Figure 6:
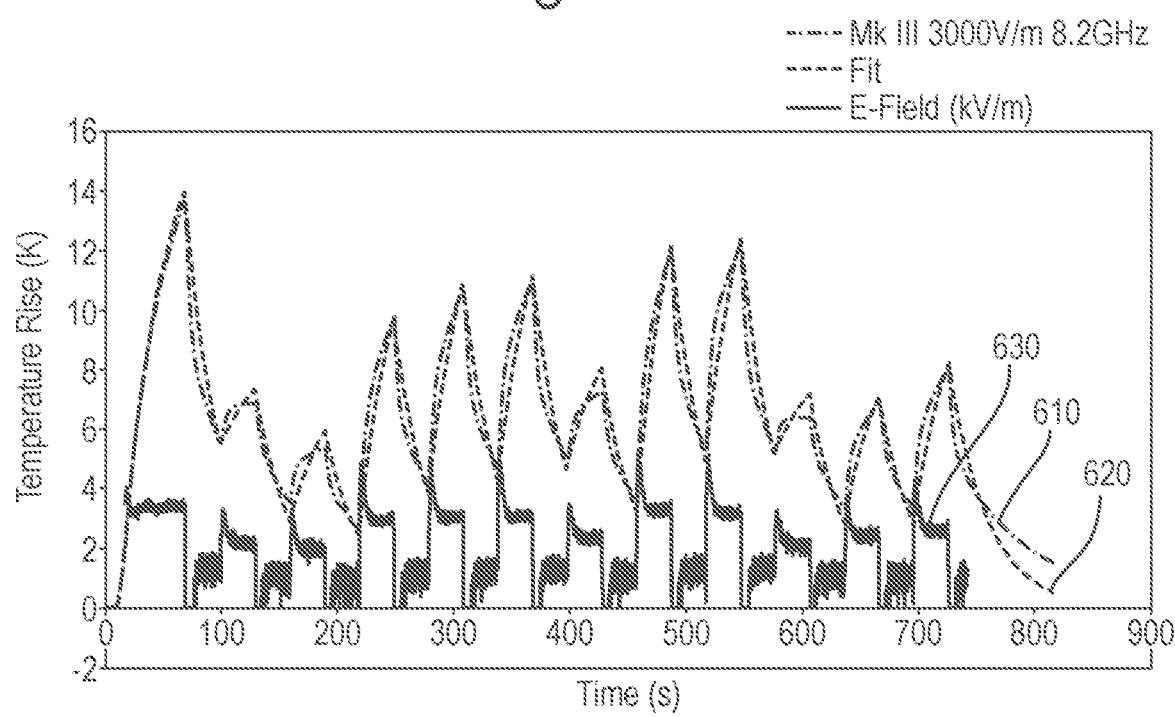
FIG. 6 illustrates further results obtained from the device of FIG. 4 when exposed to a sequence of 12 relatively higher test fields
Figure 7:
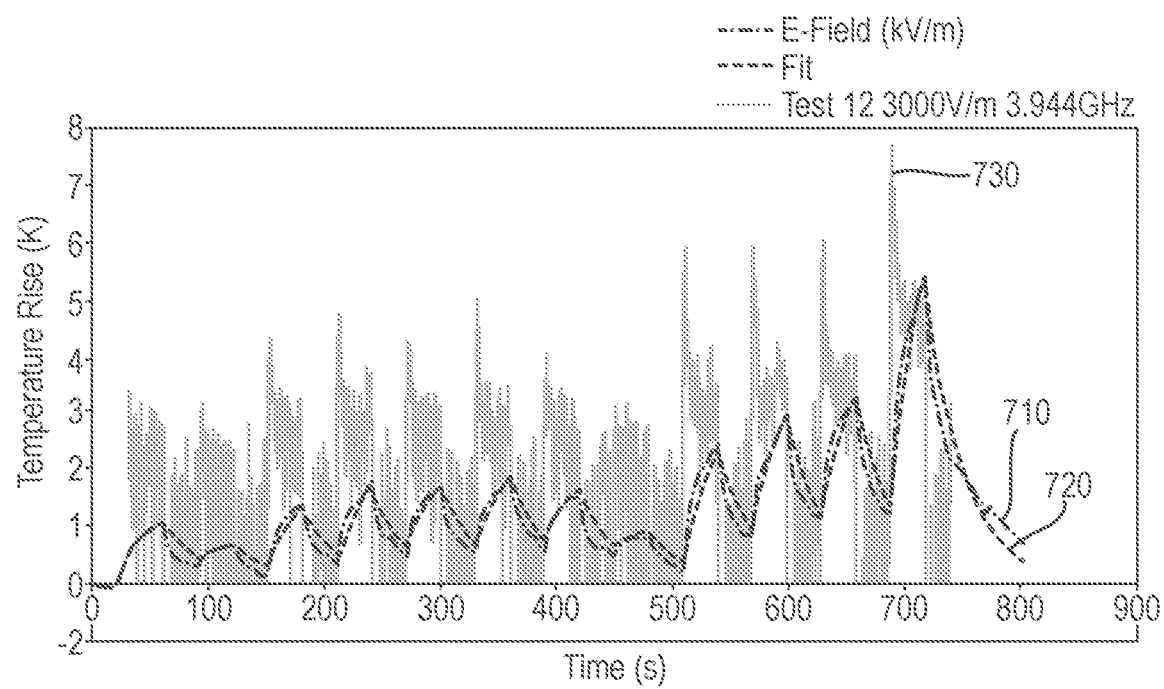
FIG. 7 illustrates yet further results obtained from the device of FIG. 4 when exposed to a sequence of 12 test fields with a preliminary numerical conversion of the results back into applied field strengths (green trace).

The device 400 was tested in a reverberation chamber in which the electric field strength could be controlled. These tests confirmed the suitability of device 400 to function as an electric field sensor and will now be described. Within the reverberation chamber a paddle is present to enable modetuned testing. For a given applied field strength the paddle was moved between twelve different positions, with the field applied for a period of 30 seconds at each paddle position, followed by a 30 second rest period. The field strength could be confirmed using a standard horn antenna present in the chamber. The results of the tests are shown in FIGS. 5, 6 and 7. These tests demonstrate the effectiveness of the device to measure electric field.

FIG. 5 illustrates the results obtained for an applied field of 500 V/m at a frequency of 8.2 GHz. The Figure shows the variation of the temperature difference recorded between the first and second temperature sensors with time as the field is turned on and off and the paddle moved between the twelve positions. The continuous line 510 shows the actual measurements, taken at 1 ms intervals, after a rolling average over a 1 s period (or 1000 data points) has been applied to smooth the data. As is apparent from FIG. 5, the remaining noise level was around 0.01 K. It is noted that a different response is recorded for each of the paddle positions. This is expected because the wavelength of the electric field at 8.2 GHz is long in comparison to the sensor and so, as the paddle position changes and the standing wave pattern within the chamber alters, the sensor may experience a varying field depending on whether it is located at a node or antinode of the field, or between the two. These different responses therefore suggest the device 400 is responsive to varying electric fields.

The dashed line 520 illustrates a fit made to the data collected. The fitting procedure is based on the analysis provided above, using a difference relation derived below. This difference relation procedure enables a calibration to be achieved despite the temperature difference not returning to null in the 30 second cooling periods. Differentiating (16) with respect to time, and substituting temperature θ for time in the result:

$$\frac{d\theta}{dt} = \frac{BP}{\tau}\left[1 - \frac{\theta}{BP}\right] \quad (21)$$

from which a fit temperature for a subsequent time step can be derived:

$$\theta_{n+1} = \theta_n + \Delta t\left(\frac{BP - \theta_n}{\tau}\right) \quad (22)$$

A fixed value of τ is required for all of the fitted curves, but, as explained above, the value of B can vary for different frequency electric fields. A new value of P is required at each different paddle position, and, in the cooling period, P=0. A first estimate to the value of P for each paddle position can be obtained from the peak temperature difference at that paddle position, and it is apparent that this procedure results in a good fit to the observed data. It will be appreciated that this procedure can also be applied to continuously varying applications of power to the chamber. For example the response of the device 400 to a sinusoidal power density can be generated by incorporating the sinusoidal variation into the P factor.

The noise level apparent in FIG. 5 of around 0.01 K suggests that the device 400 should be capable of detecting and approximately measuring electric field strength down to that field for which the predicted peak temperature is 0.01 K. The peak temperature rise in FIG. 5 is 0.38 K, and so the minimum field strength detectable would be expected to be 500×√0.01/0.38 V/m (since the temperature rise is proportional to the power, which in turn is proportional to the square of the field strength). This is approximately 80 V/m. However, improvements in sensitivity can readily be obtained with a longer exposure time to the field, since the maximum temperature rise was not achieved, as can be seen from FIG. 5 in which the measured temperature difference is still increasing when the field is turned off for each change in the paddle position. It is expected that sensitivity to fields of order 50 V/m could be achieved with the device 400.

FIG. 6 illustrates the results obtained for an applied field of 3000 V/m at a frequency of 8.2 GHz. A first continuous line 610 shows the actual results obtained, smoothed as above, and dashed line 620 shows a fit to the data, obtained as described above with respect to FIG. 5. With the exception of the different field the trial was run as that described above with respect to FIG. 5. In this case, however, the root mean square electric field has been calculated from the temperature data, and is shown as line 630. This has been done using a rough estimate of the temperature gradient calculated from the relative temperature rise 50 time steps ahead (equivalent to 0.05 s) at each time step and using (21) above, rearranged to provide P as a function of dθ/dt and θ.

The resultant estimate is noisy, and exhibits a peak when the paddle position is changed each time the field is switched back on. The spurious but narrow peak results from the failure of the assumptions made in the approximate analysis above. When the field is initially turned on, heat from the Eccosorb® absorber (which acts as a thermal insulator) has not yet begun to dissipate through the HDPE thermal insulation and into the environment. It is thought that this may result in a faster initial temperature rise than expected from the approximate analysis above. An improved continuous conversion of the output temperature readings to incident power could be obtained with an improved theoretical model of the device, in addition to a better statistical fit to the temperature variation gradient.

FIG. 7 illustrates the results obtained for an applied field of 3000 V/m at a frequency of 3.944 GHz, processed as for the data shown in FIG. 6 above, with lines 710, 720, and 730 representing, respectively, the smoothed raw data, a fit to the data, and the derived electric field. At this lower frequency the sensitivity of the device 400 is lowered, at least partly because the absorptivity of the Eccosorb® is lower than at the higher frequency (15 dB/cm as compared to 37 dB/cm at the higher frequency), and possibly also because the device itself reflects a larger portion of the incident RF energy at the lower electric field value.

Whilst a number of exemplary embodiments have been described in the above, it will be noted that variations and modifications to the above-described embodiments will be possible without departing from the scope of the invention, which is defined in the accompanying claims. In particular, it will be noted that it will be possible to use alternatives to the materials used in the above-described embodiments, or to use alternative sizes or shapes of the absorber kernel or thermal insulation. Such modifications can be made in dependence on the required sensitivity of the device for any particular application, or in dependence on convenience. Alternative absorber materials are commercially available, or materials not specifically designed for electromagnetic absorption can be used. For example it has been found that graphite can make a suitable absorber material, albeit with reduced sensitivity in comparison to the embodiments described in the above description, and tests of an alternative device using graphite (in particular a material consisting of 82% graphite, 21% clay, and 5% wax, as can be found in a 5B pencil lead) as the absorber material have demonstrated that useful measurements can be made using such a device. Moreover it will be possible to use alternative materials in order to configure the device to function in different frequency electromagnetic fields.

Different types of optically interrogable temperature sensors may also be used, and, in addition, it may be possible for some applications to use other types of temperature sensor, such as resistivity-based temperature sensors, which require wires for their operation. This may, for example, be possible where it is desired to sense the electric field near the wall of a metal cavity into which a hole can be drilled, so that wires to the temperature sensor do not significantly protrude into the region of the electric field to be measured, where they would themselves perturb the measured field.

Finally, it should be clearly understood that any feature described above in relation to any one embodiment may be used alone, or in combination with other features described, and may also be used in combination with one or more features of any other of the embodiments, or any combination of any other of the embodiments.

The invention claimed is:

1. A device for determining a strength of an oscillating electric field, the device comprising an absorber to absorb radiation at the frequency of the oscillating electric field, and a thermal insulator transparent to radiation at the frequency of the oscillating electric field, which thermal insulator is arranged to thermally insulate the absorber; and the device further comprising a first temperature sensor arranged to measure the temperature of the absorber, and a second temperature sensor arranged to measure the temperature external to the thermal insulator.

2. A device as claimed in claim 1 wherein the first temperature sensor is embedded within the absorber.

3. A device as claimed in claim 1 wherein the second temperature sensor is located on an external surface of the thermal insulator.

4. A device as claimed in claim 1 wherein the first and second temperature sensors each comprise an optically interrogable sensing element responsive to changes in temperature.

5. A device as claimed in claim 1 wherein the oscillating electric field is a radio frequency field.

6. A device as claimed in claim 1 wherein a dimension of the absorber is comparable to or less than the absorption length of the absorber.

7. A method of measuring electric field strength using a device as claimed in claim 1, comprising monitoring the difference in temperatures measured by the first and second temperature sensors to determine at least one of a maximum temperature difference and an initial temperature gradient.

8. A method of measuring electric field strength using a device as claimed in claim 1, comprising monitoring the difference in temperatures measured by the first and second temperature sensors to determine a set of temperature differences, and fitting the set of temperature differences to an exponential approach to an equilibrium temperature.

9. A device for determining a strength of an oscillating electric field, the device comprising an absorber to absorb radiation at the frequency of the oscillating electric field, and a thermal insulator transparent to radiation at the frequency of the oscillating electric field, which thermal insulator is arranged to thermally insulate the absorber; and the device further comprising a first temperature sensor arranged to measure the temperature of the absorber, and a second temperature sensor arranged to measure the temperature external to the thermal insulator, wherein the absorber and the thermal insulator are configured such that the difference in temperatures recorded by the first and second temperature sensors approaches an equilibrium value with a characteristic time constant less than two hundred seconds.

10. A device as claimed in claim 1 wherein the absorber material is selected from graphite or Eccosorb®.

11. A device as claimed in claim 1 wherein the thermal insulation is selected from expanded polystyrene or high-density polyethylene.

12. A device as claimed in claim 1 wherein the thermal insulation encloses the absorber.

13. A device as claimed in claim 9 wherein the characteristic time constant less than thirty seconds.

14. A device as claimed in claim 9 wherein the characteristic time constant less than five seconds.

15. A device as claimed in claim 9 wherein the characteristic time constant less than one second.

16. A device as claimed in claim 1 wherein the first and second temperature sensors are interrogable via first and second respective optical fibres.

17. A device as claimed in claim 16, further comprising a control unit coupled to the first and second optical fibres, the control unit being operable to transmit light pulses to the sensing elements of the first and second temperature sensors, to receive reflected pulses from the sensing elements, and to process the received reflected pulses to determine the temperature of first and second temperature sensors.

18. A device as claimed in claim 17, wherein the control unit is operable to determine the electric field strength to which the absorber is exposed from the difference between the temperatures measured by the first and second temperature sensors.

19. A method of calibrating a device for measuring the strength of an oscillating electric field, the device comprising an absorber to absorb radiation at the frequency of the oscillating electric field, and a thermal insulator transparent to radiation at the frequency of the oscillating electric field, which thermal insulator is arranged to thermally insulate the absorber; and the device further comprising a first temperature sensor arranged to measure the temperature of the absorber, and a second temperature sensor arranged to measure the temperature external to the thermal insulator, comprising the steps of:
   a. preparing the device by placing it in a region devoid of any electric field, such that the first and second temperature sensors measure the same temperature;
   b. applying a known and constant electric field to the device;
   c. operating the first and second temperature sensors as the constant electric field is applied to determine a plurality of sets of temperature measurements, each of the plurality of sets of measurements being spaced apart by a temporal interval;
   d. determining, for each of the plurality of sets of temperatures measurements, the difference between the temperature measured by the first temperature sensor and the temperature measured by the second temperature sensor; thereby determining a plurality of temperature differences; and
   e. calculating first and second calibration constants by fitting the plurality of temperature differences to an exponential approach to an equilibrium temperature difference, the first calibration constant defining a characteristic time constant of the device, and the second calibration constant relating an equilibrium temperature difference to a power of the electric field.

20. A method as claimed in claim 19, wherein the temporal interval is short relative to the characteristic time constant, and wherein the plurality of sets of measurements span a time comprising at least two time constants.

* * * * *